(12) United States Patent
Whitney et al.

(10) Patent No.: US 6,628,498 B2
(45) Date of Patent: Sep. 30, 2003

(54) INTEGRATED ELECTROSTATIC DISCHARGE AND OVERCURRENT DEVICE

(76) Inventors: Steven J. Whitney, 942 Warwick La., Lake Zurich, IL (US) 60047; Nate Maercklein, 909 Panorama Dr., Apt. 202, Palatine, IL (US) 60067; Rob Deblieck, 15 Copperfield Dr., Hawthorn Woods, IL (US) 60047; Scott Davidson, 703 Dean St., Woodstock, IL (US) 60098

( * ) Notice: Subject to any disclaimer, the term of this patent is extended or adjusted under 35 U.S.C. 154(b) by 24 days.

(21) Appl. No.: 09/919,397

(22) Filed: Jul. 31, 2001

(65) Prior Publication Data

US 2002/0024791 A1 Feb. 28, 2002

Related U.S. Application Data

(63) Continuation-in-part of application No. 09/649,533, filed on Aug. 28, 2000.

(51) Int. Cl.[7] .................................................. H01C 7/12
(52) U.S. Cl. ........................................ 361/119; 361/119
(58) Field of Search ............................... 361/93.1, 91.1, 361/103, 127, 111, 93, 56, 91, 118; 338/22 R, 21

(56) References Cited

U.S. PATENT DOCUMENTS

| 2,273,704 A | 2/1942 | Grisdale |
| 2,978,665 A | 4/1961 | Vernet et al. |
| 3,241,026 A | 3/1966 | Andrich |
| 3,243,753 A | 3/1966 | Kohler |
| 3,351,882 A | 11/1967 | Kohler et al. |
| 3,591,526 A | 7/1971 | Kawashima et al. |
| 3,685,026 A | 8/1972 | Wakabayashi et al. |
| 3,685,028 A | 8/1972 | Wakabayashi et al. |
| 3,823,217 A | 7/1974 | Kampe |
| 3,828,332 A | 8/1974 | Rekai |
| 3,858,144 A | 12/1974 | Bedard et al. |

(List continued on next page.)

FOREIGN PATENT DOCUMENTS

| CA | 1254323 | 5/1989 |
| DE | 1253332 | 4/1965 |
| EP | 0 169 059 A2 | 1/1986 |

(List continued on next page.)

OTHER PUBLICATIONS

Yoshio Sorimachi, Ichiro Tsubata and Noboru Nishizawa, The Transactions of the Institute of Electronics and Communications Engineers of Japan—Analysis of Static Self Heating Characteristics of PTC Thermistor Based on Carbon Black Graft Polymer, vol. J61–C, No. 12, pp. 767–774 (Dec. 25, 1978).

Ichiro Tsubata and Yoshio Sorimachi, Faculty of Engineering, Niigata University—PTC Characteristics and Components on Carbon Black Graft Polymer, pp. 31–38 (with translation).

(List continued on next page.)

Primary Examiner—Brian Sircus
Assistant Examiner—Danny Nguyen
(74) Attorney, Agent, or Firm—Bell, Boyd & Lloyd LLC

(57) ABSTRACT

An electrical circuit protection device has an overcurrent protection portion and an overvoltage protection portion. The overcurrent protection portion has a surface. The overvoltage protection portion is disposed on the surface. In one preferred embodiment, the overcurrent portion includes a PTC device and the overvoltage portion includes a voltage variable material. A number of terminations are configured to connect the overcurrent protection portion and the overvoltage protection portion to a printed circuit board.

22 Claims, 7 Drawing Sheets

U.S. PATENT DOCUMENTS

| | | |
|---|---|---|
| 4,045,712 A | 8/1977 | DeTommasi |
| 4,124,747 A | 11/1978 | Murer et al. |
| 4,169,816 A | 10/1979 | Tsien |
| 4,177,376 A | 12/1979 | Horsma et al. |
| 4,177,446 A | 12/1979 | Diaz |
| 4,188,276 A | 2/1980 | Lyons et al. |
| 4,223,209 A | 9/1980 | Diaz |
| 4,237,441 A | 12/1980 | van Konynenburg et al. |
| 4,238,812 A | 12/1980 | Middleman et al. |
| 4,252,692 A | 2/1981 | Taylor et al. |
| 4,259,657 A | 3/1981 | Ishikawa et al. |
| 4,272,471 A | 6/1981 | Walker |
| 4,304,987 A | 12/1981 | van Konynenburg |
| 4,318,220 A | 3/1982 | Diaz |
| 4,327,351 A | 4/1982 | Walker |
| 4,329,726 A | 5/1982 | Middleman et al. |
| 4,330,703 A | 5/1982 | Horsma et al. |
| 4,330,704 A | 5/1982 | Jensen |
| 4,331,948 A | 5/1982 | Malinaric et al. |
| 4,359,414 A | 11/1982 | Mastrangelo |
| 4,367,168 A | 1/1983 | Kelly |
| 4,383,942 A | 5/1983 | Davenport |
| 4,388,607 A | 6/1983 | Toy et al. |
| 4,413,301 A | 11/1983 | Middleman et al. |
| 4,426,546 A | 1/1984 | Hotta et al. |
| 4,426,633 A | 1/1984 | Taylor |
| 4,445,026 A | 4/1984 | Walker |
| 4,475,138 A | 10/1984 | Middleman et al. |
| 4,534,889 A | 8/1985 | van Konynenburg et al. |
| 4,548,740 A | 10/1985 | von Tomkewitsch et al. |
| 4,560,498 A | 12/1985 | Horsma et al. |
| 4,617,609 A | 10/1986 | Utner et al. |
| 4,685,025 A | 8/1987 | Cartomagno |
| 4,689,475 A | 8/1987 | Kleiner et al. |
| 4,724,417 A | 2/1988 | Au et al. |
| 4,726,991 A | 2/1988 | Hyatt et al. |
| 4,732,701 A | 3/1988 | Nishii et al. |
| 4,749,623 A | 6/1988 | Endo et al. |
| 4,774,024 A | 9/1988 | Deep et al. |
| 4,775,778 A | 10/1988 | van Konynenburg et al. |
| 4,800,253 A | 1/1989 | Kleiner et al. |
| 4,801,785 A | 1/1989 | Chan et al. |
| 4,857,880 A | 8/1989 | Au et al. |
| 4,876,439 A | 10/1989 | Nagahori |
| 4,878,038 A | 10/1989 | Tsai |
| 4,880,577 A | 11/1989 | Okita et al. |
| 4,882,466 A | 11/1989 | Friel |
| 4,884,163 A | 11/1989 | Deep et al. |
| 4,907,340 A | 3/1990 | Fang et al. |
| 4,910,389 A | 3/1990 | Sherman et al. |
| 4,924,074 A | 5/1990 | Fang et al. |
| 4,951,382 A | 8/1990 | Jacobs et al. |
| 4,955,267 A | 9/1990 | Jacobs et al. |
| 4,959,632 A | 9/1990 | Uchida |
| 4,966,729 A | 10/1990 | Carmona et al. |
| 4,967,176 A | 10/1990 | Horsma et al. |
| 4,971,726 A | 11/1990 | Maeno et al. |
| 4,973,934 A | 11/1990 | Saito et al. |
| 4,980,541 A | 12/1990 | Shafe et al. |
| 4,983,944 A | 1/1991 | Uchida et al. |
| 5,068,061 A | 11/1991 | Knobel et al. |
| 5,089,801 A | 2/1992 | Chan et al. |
| 5,099,380 A | 3/1992 | Childers et al. |
| 5,106,538 A | 4/1992 | Barma et al. |
| 5,106,540 A | 4/1992 | Barma et al. |
| 5,136,365 A | 8/1992 | Pennisi et al. |
| 5,140,297 A | 8/1992 | Jacobs et al. |
| 5,142,263 A | 8/1992 | Childers et al. |
| 5,143,649 A | 9/1992 | Blackledge et al. |
| 5,171,774 A | 12/1992 | Ueno et al. |
| 5,174,924 A | 12/1992 | Yamada et al. |
| 5,183,698 A | 2/1993 | Stephenson et al. |
| 5,189,092 A | 2/1993 | Koslow |
| 5,190,697 A | 3/1993 | Ohkita et al. |
| 5,195,013 A | 3/1993 | Jacobs et al. |
| 5,212,466 A | 5/1993 | Yamada et al. |
| 5,214,091 A | 5/1993 | Tanaka et al. |
| 5,227,946 A | 7/1993 | Jacobs et al. |
| 5,231,371 A | 7/1993 | Kobayashi |
| 5,241,741 A | 9/1993 | Sugaya |
| 5,246,388 A | 9/1993 | Collins et al. |
| 5,247,276 A | 9/1993 | Yamazaki |
| 5,247,277 A | 9/1993 | Fang et al. |
| 5,248,517 A | 9/1993 | Shrier et al. |
| 5,250,226 A | 10/1993 | Oswal et al. |
| 5,250,228 A | 10/1993 | Baigrie et al. |
| 5,257,003 A | 10/1993 | Mahoney |
| 5,262,754 A | 11/1993 | Collins |
| 5,268,665 A | 12/1993 | Iwao |
| 5,278,535 A | 1/1994 | Xu et al. |
| 5,280,263 A | 1/1994 | Sugaya |
| 5,281,845 A | 1/1994 | Wang et al. |
| 5,289,155 A | 2/1994 | Okumura et al. |
| 5,294,374 A | 3/1994 | Martinez et al. |
| 5,303,115 A | 4/1994 | Nayar et al. |
| 5,313,184 A | 5/1994 | Greuter et al. |
| 5,337,038 A | 8/1994 | Taniguchi et al. |
| 5,340,641 A | 8/1994 | Xu |
| 5,351,026 A | 9/1994 | Kanbara et al. |
| 5,351,390 A | 10/1994 | Yamada et al. |
| 5,358,793 A | 10/1994 | Hanada et al. |
| 5,374,379 A | 12/1994 | Tsubokawa et al. |
| 5,382,384 A | 1/1995 | Baigrie et al. |
| 5,382,938 A | 1/1995 | Hansson et al. |
| 5,393,597 A | 2/1995 | Childers et al. |
| 5,399,295 A | 3/1995 | Gamble et al. |
| 5,412,865 A | 5/1995 | Takaoka et al. |
| 5,488,348 A | 1/1996 | Asida et al. |
| 5,493,266 A | 2/1996 | Sasaki et al. |
| 5,500,996 A | 3/1996 | Fritsch et al. |
| 5,543,705 A | 8/1996 | Uezono et al. |
| 5,554,679 A | 9/1996 | Cheng |
| 5,610,436 A | 3/1997 | Sponaugle et al. |
| 5,669,381 A | 9/1997 | Hyatt |
| 5,747,147 A | 5/1998 | Wartenberg et al. |
| 5,777,541 A | 7/1998 | Vekeman |
| 5,781,395 A | 7/1998 | Hyatt |
| 5,801,612 A | 9/1998 | Chandler et al. |
| 5,807,509 A | 9/1998 | Shrier et al. |
| 5,817,423 A | 10/1998 | Kajimaru et al. |
| 5,818,676 A | 10/1998 | Gronowicz, Jr. |
| 5,831,510 A | 11/1998 | Zhang et al. |
| 5,849,129 A | 12/1998 | Hogge et al. |
| 5,852,397 A | 12/1998 | Chan et al. |
| 5,864,281 A | 1/1999 | Zhang et al. |
| 5,874,885 A | 2/1999 | Chandler et al. |
| 6,023,403 A * | 2/2000 | McGuire et al. ............ 361/106 |
| 6,191,928 B1 * | 2/2001 | Rector et al. ............... 361/127 |
| 6,310,752 B1 * | 10/2001 | Shrier et al. .................. 361/56 |

FOREIGN PATENT DOCUMENTS

| | | |
|---|---|---|
| EP | 0 229 286 A1 | 7/1987 |
| EP | 0 460 790 A1 | 12/1991 |
| EP | 0 588 136 A2 | 3/1994 |
| EP | 0 731 475 A2 | 9/1996 |
| EP | 0 790 625 A2 | 8/1997 |
| EP | 0 827 160 A1 | 3/1998 |
| EP | 0 901 133 A2 | 3/1999 |
| GB | 541222 | 11/1941 |
| GB | 604695 | 7/1948 |
| GB | 1172718 | 12/1969 |

| | | |
|---|---|---|
| GB | 1449261 | 9/1976 |
| GB | 1604735 | 12/1981 |
| JP | 50-33707 | 12/1972 |
| JP | 52-62680 | 5/1977 |
| JP | 53-104339 | 8/1978 |
| JP | 58-81264 | 5/1983 |
| JP | 58-81265 | 5/1983 |
| JP | 58-162877 | 9/1983 |
| JP | 58-162878 | 9/1983 |
| JP | 60-196901 | 10/1985 |
| JP | 62-79418 | 4/1987 |
| JP | 62-79419 | 4/1987 |
| JP | 62-181347 | 8/1987 |
| JP | 63-85864 | 4/1988 |
| JP | 1-104334 | 4/1989 |
| JP | 2-109226 | 4/1990 |
| JP | 3-221613 | 9/1991 |
| JP | 3-271330 | 12/1991 |
| JP | 5-109502 | 4/1993 |
| JP | 6-209148 | 10/1994 |
| JP | 7-161503 | 6/1995 |
| JP | 9-199302 | 7/1997 |
| WO | WO 93/14511 | 7/1993 |
| WO | WO 94/01876 | 1/1994 |
| WO | WO 95/08176 | 3/1995 |
| WO | WO 95/31816 | 11/1995 |
| WO | WO 95/33276 | 12/1995 |
| WO | WO 95/33278 | 12/1995 |
| WO | WO 95/34084 | 12/1995 |
| WO | WO 96/41355 | 12/1996 |
| WO | WO 97/21230 | 6/1997 |
| WO | WO 98/12715 | 3/1998 |
| WO | WO 98/29879 | 7/1998 |
| WO | WO 98/34084 | 8/1998 |
| WO | WO 99/03113 | 1/1999 |

OTHER PUBLICATIONS

Yoxhio Sorimachi and Ichiro Tsubata, The Transactions of the Institute of Electronics and Communication Engineers of Japan—Characteristics of PTC Thermistor Based on Carbon Black Graft Polymer, vol. J60–C, No. 2, pp. 90–97 (Feb. 25, 1977).

Yoshio Sorimachi and Ichiro Tsubata, Electronics Parts and Materials, Niigata University—The Analysis of Current Falling Characteristics on C.G. (Carbon black Graft Polymer)—PTC Thermistor, Shingaku Gihou, vol. 9, pp. 23–27 ED–75–35, 75–62 (1975) (with translation).

B. Wartgotz and W.M. Alvino, Polymer Engineering and Science—Conductive Polyethylene Resins from Ethylene Copolymers and Conductive Carbon Black, pp. 63–70 (Jan. 1967).

Kazuyuki Ohe and Yoshihide Naito, Japanese Journal of Applied Physics—A New Resistor Having an Anomalously Large Positive Temperature Coefficient, vol. 10, No. 1, pp. 99–108 (Jan., 1971).

Ichiro Tsubata and Naomitsu Takashina, 10$^{th}$ Regional Conference on Carbon—Thermistor with Positive Temperature Coefficient Based on Graft Carbon, pp. 235–236 (1971).

J. Meyer, Polymer Engineering and Science—Glass Transition Temperature as a Guide to Selection of Polymers Suitable for PTC Materials, vol. 13, No. 6, pp. 462–468 (Nov., 1973).

J. Meyer, Polymer Engineering and Science—Stability of Polymer Composites as Positive—Temperature—Coefficient Resistors, vol. 14, No. 10, pp. 706–716 (Oct., 1974).

Yoshio Sorimachi and Ichiro Tsubata, Shengakeekai Parts Material—Characteristics of PTC—Thermistor Based on Carbon Black Graft Polymer, vol. 9, Paper, No. UDC 621.316.825.2: [678.744.32–13:661.666.4] (1974).

Carl Klason and Josef Kubat, Journal of Applied Polymer Science—Anomalous Behavior of Electrical Conductivity and Thermal Noise in Carbon Black—Containing Polymers at $t_o$ and $T_m$ vol. 19, pp. 831–845 (1975).

M. Narkis, A. Ram and F. Flashner, Polymer Engineering and Science—Electrical Properties of Carbon Black Filled Polyethylene, vol. 18, No. 8 pp. 649–653 (Jun. 1978).

Andries Voet, Rubber Chemistry and Technology—Temperature Effect of Electrical Resistivity of Carbon Black Filled Polymers, vol. 54, pp. 42–50.

M. Narkis, A. Ram and Z. Stein, Journal of Applied Polymer Science—Effect of Crosslinking on Carbon Black/Polyethylene Switching Materials, vol. 25, pp. 1515–1518 (1980).

Frank A. Doljack, IEEE Transactions on Components Hybrids and Manufacturing—Technology, PolySwitch PTC Devices—A New Low–Resistance Conductive Polymer–Based PTC Device for Overcurrent Protection, vol. CHMT, No. 4, pp. 372–378 (Dec. 1981).

Keizo Miyasaka, et al., Journal of Materials Science—Electrical Conductivity of Carbon–Polymer Composites as Function of Carbon Content, vol. 17, pp. 1610–1616 (1982).

D.M. Bigg, Conductivity in Filled Thermoplastics—An Investigation of the Effect of Carbon Black Structure, Polymer Morphology, and Processing History on the Electrical Conductivity of Carbon–Black–Filled Thermoplastics, pp. 501–516.

J. Yacubowicz and M. Narkis, Polymer Engineering and Science—Dielectric Behavior of Carbon Black Filled Polymer Composites, vol. 26, No. 22, pp. 1568–1573 (Dec. 1986).

Mehrdad Ghofraniha and R. Salovey, Polymer Engineering and Science—Electrical Conductivity of Polymers Containing Carbon Black, vol. 28, No. 1, p. 5863 (Mid–Jan., 1988).

J. Yacubowicz and M. Narkis, Polymer Engineering and Science—Electrical and Dielectric Properties of Segregated Carbon Black–Polyethylene Systems, vol. 30, No. 8, pp. 459–468 (Apr., 1990).

Biing–Lin Lee, Polymer Engineering and Science—Electrically Conductive Polymer Composites and Blends, vol. 32, No. 1, pp. 36–42 (Mid–Jan. 1992).

H.M. Al–Allak, A.W. Brinkman and J. Woods, Journal of Materials Science—I–V Characteristics of Carbon Black–Loaded Crystalline Polyethylene, vol. 28, pp. 117–120 (1993).

Hao Tang, et al., Journal of Applied Polymer Science—The Positive Temperature Coefficient Phenomenon of Vinyl Polymer/CB composites, vol. 48, pp. 1795–1800 (1993).

V.A. Ettel, P. Kalal, INCO Specialty Powder Products, Advances in Pasted Positive Electrode, (J. Roy Gordon Research Laboratory, Missisauga, Ont.), Presented at NiCad 94, Geneva, Switzerland, Sep. 19–23, 1994.

F. Gubbels, et al., Macromolecules—Design of Electrical Conductive Composites: Key Role of the Morphology on the Electrical Properties of Carbon Black Filled Polymer Blends, vol. 28, pp. 1559–1566 (1995).

Hao Tang, et al., Journal of Applied Polymer Science—Studies on the Electrical Conductivity of Carbon Black Filled Polymers, vol. 59, pp. 383–387 (1996).

* cited by examiner

INTEGRATED ELECTROSTATIC DISCHARGE AND OVERCURRENT DEVICE

PRIORITY CLAIM

This application is a continuation-in-part application of U.S. patent application, Ser. No. 09/649,533, filed on Aug. 28, 2000, entitled Integrated Overvoltage and Overcurrent Device.

BACKGROUND OF THE INVENTION

The present invention relates generally to a circuit protection device. In particular, the invention relates to a device for protecting electrical circuits against electrostatic discharge ("ESD") events and overcurrent conditions.

It is well known that the resistivity of many conductive materials change with temperature. Resistivity of a positive temperature coefficient ("PTC") material increases as the temperature of the material increases. Many crystalline polymers, made electrically conductive by dispersing conductive fillers therein, exhibit this PTC effect. These polymers generally include polyolefins such as polyethylene, polypropylene and ethylene/propylene copolymers. Certain doped ceramics such as barium titanate also exhibit PTC behavior.

At temperatures below a certain value, i.e., the critical or switching temperature, the PTC material exhibits a relatively low, constant resistivity. However, as the temperature of the PTC material increases beyond this point, the resistivity sharply increases with only a slight increase in temperature.

Electrical devices employing polymer and ceramic material exhibiting PTC behavior have been used as overcurrent protection in electrical circuits. Under normal operating conditions in the electrical circuit, the resistance of the load and the PTC device is such that relatively little current flows through the PTC device. Thus, the temperature of the device due to $I^2R$ heating remains below the critical or switching temperature of the PTC device. The device is said to be in an equilibrium state (i.e., the rate at which heat is generated by $I^2R$ heating is equal to the rate at which the device is able to lose heat to its surroundings).

If the load is short circuited, the current flowing through the PTC device increases and the temperature of the PTC device (due to $I^2R$ heating) rises rapidly to its critical temperature. At this point, a great deal of power is dissipated in the PTC device and the PTC device becomes unstable (i.e., the rate at which the device generates heat is greater than the rate at which the device can lose heat to its surroundings). The power dissipation only occurs for a short period of time (i.e., a fraction of a second), however, because the increased power dissipation will raise the temperature of the PTC device to a value where the resistance of the PTC device has become so high that the current in the circuit is limited to a relatively low value. This new current value is enough to maintain the PTC device at a new, high temperature/high resistance equilibrium point, but will not damage the electrical circuit components. Thus, the PTC device acts as a form of a fuse, reducing the current flow through the short circuit path to a safe, relatively low value when the PTC device is heated to its critical temperature range.

Upon interrupting the current in the circuit, or removing the condition responsible for the short circuit, the PTC device will cool down below its critical temperature to its normal operating, low resistance state. The effect is a resettable, electrical circuit protection device.

Electrical overstress transients ("EOS transients") produce high electric fields and high peak powers that can render circuits or the highly sensitive electrical components in the circuits, temporarily or permanently non-functional. EOS transients can include transient voltages or current conditions capable of interrupting circuit operation or destroying the circuit outright. EOS transients may arise, for example, from an electromagnetic pulse, an electrostatic discharge, lightning, a build up of static electricity or be induced by the operation of other electronic or electrical components. An EOS transient can rise to its maximum amplitude in subnanosecond to microsecond times and have repeating amplitude peaks.

The peak amplitude of the electrostatic discharge (ESD) transient wave may exceed 25,000 volts with currents of more than 100 amperes. There exist several standards which define the waveform of the EOS transient. These include IEC 1000-4-2, ANSI guidelines on ESD (ANSI C63.16), DO-160, and FAA-20-136. There also exist military standards, such as MIL STD 883 part 3015.

Materials exist for the protection against EOS transients ("EOS materials"), which are designed to rapidly respond (i.e., ideally before the transient wave reaches its peak) to reduce the transmitted voltage to a much lower value and clamp the voltage at the lower value for the duration of the EOS transient. EOS materials are characterized by high electrical resistance values at low or normal operating voltages and currents. In response to an EOS transient, the materials switch essentially instantaneously to a low electrical resistance state. When the EOS threat has been mitigated these materials return to their high resistance state. These materials are capable of repeated switching between the high and low resistance states, allowing circuit protection against multiple EOS events.

EOS materials also recover essentially instantaneously to their original high resistance value upon termination of the EOS transient. For purposes of this application, the high resistance state will be referred to as the "off-state" and the low resistance state will be referred to as the "on-state." EOS materials can withstand thousands of ESD events and recover to desired off-status after providing protection from each of the individual ESD events.

Circuit components utilizing EOS materials can shunt a portion of the excessive voltage or current due to the EOS transient to ground, thus, protecting the electrical circuit and its components. The major portion of the threat transient, however, is reflected back towards the source of the threat. The reflected wave is either attenuated by the source, radiated away, or re-directed back to the surge protection device which responds with each return pulse until the threat energy is reduced to safe levels.

In certain situations, an EOS voltage may be continuous rather than transient in nature. For example, if an AC power line falls across a telecom line, a continuous abnormally high voltage may be induced into the telecom equipment at both ends of the line. Another example involves the connection of the wrong battery charger or battery eliminator to a piece of portable electronic equipment such as a cell phone. In both of these examples, specific types of overvoltage protectors might be used to protect the equipment from the abnormally high continuous voltage for a finite period of time. It is also common to rely on an overcurrent protector to limit current to the overvoltage protector and associated equipment to protect against self-heating.

It should be appreciated from the foregoing discussion that many electrical and electronic circuits require overcurrent and overvoltage protection. FIG. 1 shows a circuit diagram of a typical circuit incorporating overcurrent and overvoltage protection. Generally, the overcurrent and overvoltage protection is obtained through at least two discrete devices. Each device provides protection for a specific application. For example, a discrete PTC current limiter 10 provides protection during overcurrent situations. In addition, a discrete ESD protection device 12 provides protection during ESD events or EOS transients. The two discrete devices are interconnected through printed circuit board traces. As a result, valuable space of the printed circuit board is utilized by the footprint of each discrete component.

Printed circuit board designers are always looking for ways to reduce the footprint of components in an effort to reduce the circuit board space needed. Thus, there is a need to reduce the size of integrated overcurrent and overvoltage protection devices.

A number of other disadvantages also occur when circuits have discrete electrical protection devices. Electrical coordination problems arise with the discrete devices making it difficult to assure coordination between the voltage suppressor protecting at overvoltage conditions and the thermal protector protecting during overcurrent conditions. Coordination between devices is important to eliminate damage to a circuit and its components in any overcurrent or overvoltage condition. One reason that makes coordination between the discrete devices difficult is because discrete devices are often times made by different manufacturers. As such, the burden is placed on the circuit board designer to coordinate the discrete devices together in order to obtain the proper overcurrent and overvoltage protection of the circuit and its components. Determining proper electrical coordination between the devices is not a simple procedure. It takes time to evaluate criteria of each device (e.g., time versus current curves, voltage versus current curves, etc.) to make sure that protection against excessive voltages and currents will result. In addition, specification tolerances for the discrete devices of different manufacturers may vary resulting in poor coordination between the discrete devices even when a proper evaluation is conducted by the designer.

Another concern exists with the existing discrete devices is that the discrete devices may not be fast enough during overvoltage conditions for certain applications. To this extent, sensitive circuitry can easily be damaged.

A need therefore exists for an improved means for providing protection against ESD events and excessive currents.

SUMMARY OF THE INVENTION

The present invention provides an improved circuit protection device having a PTC current limiter and an ESD protection material within a single package. The improved circuit device achieves overcurrent and overvoltage protection. At the same time, the device of the present invention provides accelerated PTC switching during an overvoltage condition due to a high degree of thermal coupling. Moreover, the device of the present invention assures coordination between a voltage suppressor and a PTC element.

To this end, in an embodiment of the present invention, an electrical circuit protection device is provided. The device includes an overcurrent protection portion having a surface. A voltage variable material is disposed on the surface. An overcurrent termination is provided on the device, which electrically communicates with the overcurrent protection portion. An overvoltage termination is provided on the device, which electrically communicates with the voltage variable material.

In an embodiment, the overcurrent protection portion includes a PTC element.

In an embodiment, the overcurrent protection portion includes a first substrate and a second substrate, each substrate having an electrode disposed thereon, and a PTC element positioned between the first and second substrates and electrically connected to the electrodes.

In an embodiment, voltage variable material is disposed onto the outer surfaces of both substrates.

In an embodiment, the overcurrent termination electrically communicates with the overcurrent protection portion and the voltage variable material.

In an embodiment, the device includes a plurality of overvoltage terminations.

In an embodiment, the device includes at least one gap on the surface between two terminations, wherein each gap is covered by the voltage variable material.

In an embodiment, the device includes at least one overcurrent termination, at least one overvoltage termination and at least one a common termination.

In an embodiment, the device includes a spark gap on the surface between the overcurrent termination and the common termination or between the overvoltage termination and the common termination, wherein the gap is covered by the voltage variable material.

In an embodiment, the device includes a plurality of overvoltage terminations that are configured to electrically communicate with a plurality of data lines disposed on a printed circuit board.

In an embodiment, the overvoltage and overcurrent terminations are configured to electrically communicate on a printed circuit board with a Universal Serial Bus port or an Institute of Electrical and Electronics Engineers ("IEEE") 1394 port.

In an embodiment, the device is provided in an 1812, 2029 or 3425 package size.

In an embodiment, the voltage variable material includes a matrix of conductive and semiconductive particles.

In an embodiment, the voltage variable material includes irregularly shaped conductor particles having insulative oxide surface coatings that are bound in a matrix.

In an embodiment, the voltage variable material includes a mixture of conductive and semiconductive particles having surfaces coated with an insulative oxide film, the conductive and semiconductive particles being bound together in an insulative binder.

In an embodiment, the voltage variable material includes conductive and semiconductive particles that are coated with an insulative oxide film and that are bound together in point contact with one another.

In another embodiment of the present invention, an electrical circuit protection device is provided. The device includes an overcurrent protection portion having a first surface. A voltage variable material is disposed on the first surface. At least one termination for each of the overcurrent protection portion, the voltage variable material and a common connection is provided on the device. A gap on the first surface between two terminations is provided, wherein the gap is covered by the voltage variable material.

In an embodiment, the overcurrent protection portion has a second surface and voltage variable material disposed on the second surface.

In an embodiment, the device includes a gap between two terminations on the second surface, wherein the gap is covered by the voltage variable material.

In a further embodiment of the present invention, an electrical circuit protection device is provided. The device includes a first substrate having top and bottom surfaces and an electrode disposed on its top surface. A second substrate is provided having top and bottom surfaces and an electrode is disposed on its bottom surface. A PTC element is positioned between the first and second substrates and electrically connects to the electrodes. Voltage variable material is disposed on the top surface of the second substrate.

In an embodiment, the device includes voltage variable material disposed on the bottom surface of the first substrate.

Accordingly, it is an advantage of the present invention to provide a discrete overvoltage and overcurrent protection device.

A further advantage of the present invention is to provide an improved device that reduces the footprint requirements on a printed circuit board and provides both overcurrent and overvoltage protection.

A still further advantage of the present invention is to provide an improved device having improved PTC switching characteristics during a continuous overvoltage condition.

Another advantage of the present invention is to provide an improved device that assures electrical coordination between the overvoltage protection and the overcurrent protection.

Yet another advantage of the present invention is to provide an improved device that readily connects to the transmission lines and other lines of known data transfer interfaces.

Additional features and advantages of the present invention will be described in and are apparent from the detailed description of the presently preferred embodiments and the figures.

DETAILED DESCRIPTION OF THE PRESENTLY PREFERRED EMBODIMENTS

The present invention provides an integrated circuit protection device for protecting electrical circuits against excessive voltage and excessive current conditions. The present invention also includes a method for manufacturing the circuit protection device.

Generally, the present invention combines an overvoltage protective device, such as a semiconductor device having characteristics similar to a zener diode or a thyristor (depending on the application) and/or a voltage variable material, with an overcurrent protective device, such as a PTC current limiter. The two components are electrically, physically and thermally coupled together as indicated in greater detail below.

Figure 1:
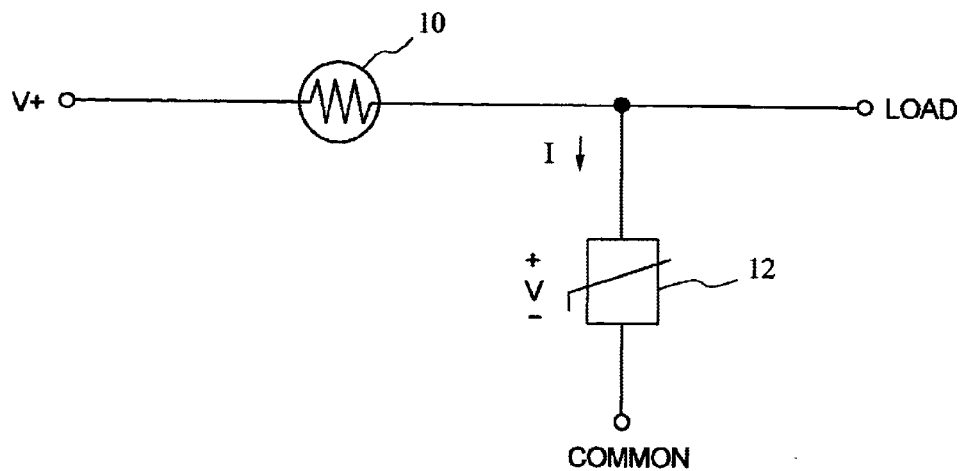
FIG. 1 illustrates a circuit diagram for a conventional circuit that has overcurrent and overvoltage protection.
Figure 2:
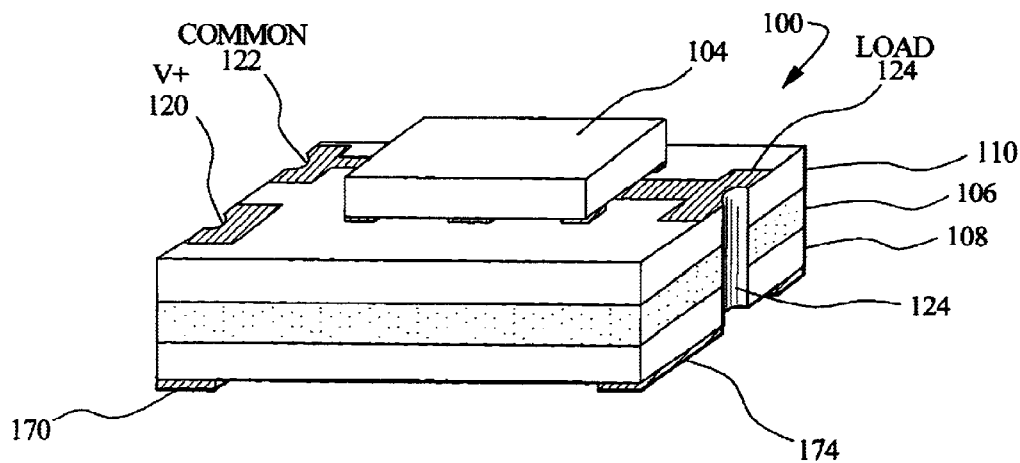
FIG. 2 illustrates a perspective view of an integrated circuit device according to an embodiment of the invention.
Figure 3:
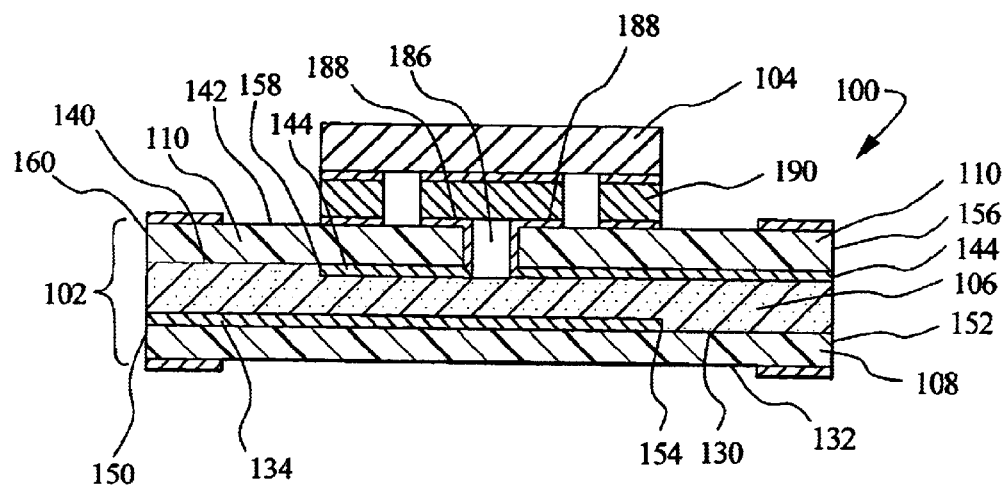
FIG. 3 illustrates a cross-sectional view of the integrated circuit device of FIG. 2.

FIGS. 2 and 3 illustrate an overcurrent and overvoltage protection device 100 of the present invention in a single integral package. Generally, the device 100 includes a PTC carrier 102 and a voltage suppressor 104 that are thermally coupled together. The PTC carrier 102 includes a PTC element 106 interposed between first and second substrates 108, 110. The PTC element and voltage suppressor 104 are electrically connected to terminations 120, 122, 124.

The first and second substrates 108, 110 of the PTC carrier 102 are, preferably, electrically insulating and provide support for the device 100. Suitable materials for use as the substrates in the present invention include, but are not limited to: FR-4 glass/epoxy, ceramic, glass and melamine. The first substrate 108 has a top surface 130 and a bottom surface 132. A first electrode 134 is formed on the top surface 130. The second substrate 110 has a first (bottom) surface 140 and a second (top) surface 142. A second electrode 144 is formed on the first surface 140 of the substrate 110.

In general, the electrodes 134, 144 can be formed of any conductive metal, e.g., silver, copper, zinc, nickel, gold, and alloys thereof, and can be applied on the substrates in a variety of ways. For example, the metal may be applied as a laminate to the substrate. In this example, the laminate is then selectively removed through a photolithography or photoetching process. Alternatively, the metal can be applied through an additive process where the metal is applied through a variety of different processes—typically electrolyzed plating to the substrate. To this extent, the metal can be applied in a selective manner or as a continuous layer that is selectively removed to form the desired pattern. Another example of a process is depositing the metal on the substrate by any other conventional deposition method, e.g., vapor deposition, sputtering, etc.

The first electrode 134 extends to one end 150 of the first substrate 108, but not to the other end 152. As such, the first electrode 134 ends to an area 154 along the top surface 130 of the first substrate 108. On the other hand, the second electrode 144 extends across the bottom surface 140 from an end 156 of the second substrate 110 opposite the end 150 of the first substrate 108 that the first electrode 134 extended from. The second electrode 144 extends to an area 158 along the surface 140 of the second substrate but and not to the other end 160 of the second substrate 110 (the other end 160 of the second substrate 110 being on the same side of the device as the end 150 that the first electrode 108 extends from). This offset configuration of the electrodes is important to make the proper electrical connections with the terminations 120, 122, 124.

The PTC element 106 is composed of a PTC composition that includes a polymer component and a conductive filler component. The polymer component may have a polyolefin having a crystallinity of at least 20%. Suitable polymers include polyethylene, polypropylene, polybutadiene, polyethylene acrylates, ethylene acrylic acid copolymers, and ethylene propylene copolymers. In a preferred embodiment, the polymer component includes polyethylene and maleic anhydride, e.g., Fusabond™ brand manufactured and sold by DuPont. The conductive filler is dispersed throughout the polymer component in an amount sufficient to ensure that the composition exhibits PTC behavior. Alternatively, the conductive filler can be grafted to the polymer component.

Generally, the conductive filler component will be present in the PTC composition by approximately 25–75% by weight. Suitable conductive fillers to be used in the present invention include powders, flakes or spheres of the following metals: nickel, silver, gold, copper, silver-plated copper or metal alloys. The conductive filler may also include carbon black, carbon flakes or spheres or graphite. Particularly useful PTC composition have a resistivity at 25° Celsius of less than 5 ohm cm, especially less than 3 ohm cm, and preferably less than 1 ohm cm, e.g., 0.5 to 0.1 ohm cm. By way of further example, not limitation, suitable PTC composition for use in the present invention are disclosed in U.S. patent application Ser. No. 08/614,038 and U.S. Pat. Nos. 4,237,441, 4,304,987, 4,849,133, 4,880,577, 4,910,389 and 5,190,697, the disclosures of which are incorporated herein by reference.

The PTC element 106 is provided, preferably, by extruding PTC material into thin sheets. The PTC sheets are interposed between large panels of first and second substrates 108, 110. Essentially, the PTC material is sandwiched between the first and second substrates 108, 110 making direct and electrical contact with the electrodes 134, 144. The PTC material and substrates are subjected to heat and pressure. In this regard, the PTC element 106 fills the void or uneven surface created by the electrodes 134, 144 and the terminations 120, 122, 124 covering only a portion of the surfaces 130, 140 of the substrates.

The terminal configuration for the overcurrent and overvoltage device 100 has terminals 120, 122, 124 that are formed as castellated contacts on the respective ends of the first substrate and second substrate 108, 110. The castellated contacts include a metallized surface that extends from the top surface of the second substrate to the bottom surface of the first substrate.

It should be noted that the terminal configuration of the device 100 of the present invention should not be limited with respect to the number, exact physical dimensions or placement of the terminations upon the substrate. In this regard, the location of the terminal configuration is due in part to the manufacturing process of the device. As stated earlier, the devices 100 can be manufactured from large panels or sheets of substrate and PTC material. The large panels or sheets are then cut into the discrete devices during the manufacturing process. Thus, the castellated contacts are cut in half forming a half circle termination. Moreover, some applications may require additional terminations to other components or equipment for protection.

Figure 4:
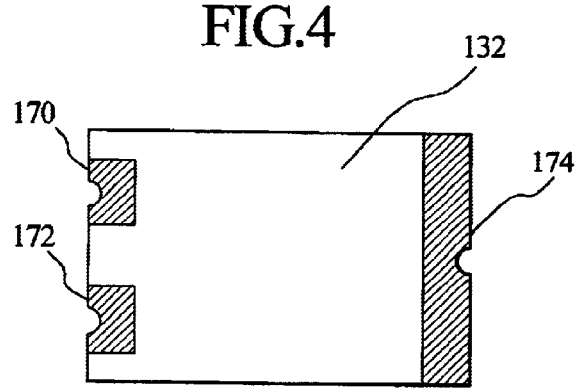
FIG. 4 illustrates a bottom plan view of the integrated circuit of FIG. 2.

As shown in FIG. 4, the bottom surface 132 of the first substrate 108 includes mounting pads 170, 172, 174 for mounting the device 100 to a printed circuit board (not shown). The mounting pads 170, 172, 174 may be formed at the same time as the castellated contacts. The mounting pads mount the device 100 to the printed circuit board and provide termination connections to V+, common ground, and the load, respectively. Again, the mounting pads 170, 172, 174 are formed from a conductive metal that can be applied through any of the processes described above.

Figure 5:
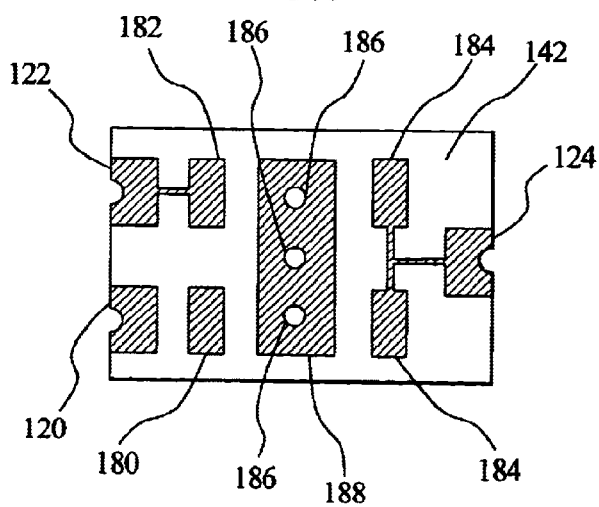
FIG. 5 illustrates a top plan view of a PTC carrier of the integrated circuit device of FIG. 2.

As shown in FIG. 5, the second surface 142 of the second substrate 110 includes the castellated contacts 120, 122, 124 and additional mounting pads 180, 182, 184. Mounting pads 180, 182, 184 are positioned on the second substrate 110 according to the specification requirements of the footprint of the voltage suppressor 104. The castellated contacts and the voltage suppressor mounting pads are electrically interconnected. This interconnection can be accomplished in a variety of ways, for example, selectively metallizing the surface 142.

The second substrate 110 includes at least one via or through hole 186 that extends from the top surface 142 to the bottom surface 144. The vias 186 are coated or plated with a conductive metal of the types described above or a conductive epoxy. Moreover, the metal may be laminated or deposited in the via 186 by similar methods to those described above with respect to the surfaces of the substrates. To this extent, a metallized area 188 may be formed around the vias 186 and/or on the surface 142 of the second substrate 110. As described in further detail below, the vias 186 act as a heat pipe conducting heat away from the voltage suppressor 104 to the PTC element 106.

The voltage suppressor 104 is attached to the second substrate 110 by a bond 190 using, for example, standard reflow soldering techniques. To this extent, the solder 190 also fills any remaining space in the vias 186. However, the vias 186 could also be completely plated through in which case no space remains in the vias 186 to be filled with solder. In this example, the solder is applied only on the mounting pads.

Figure 6:
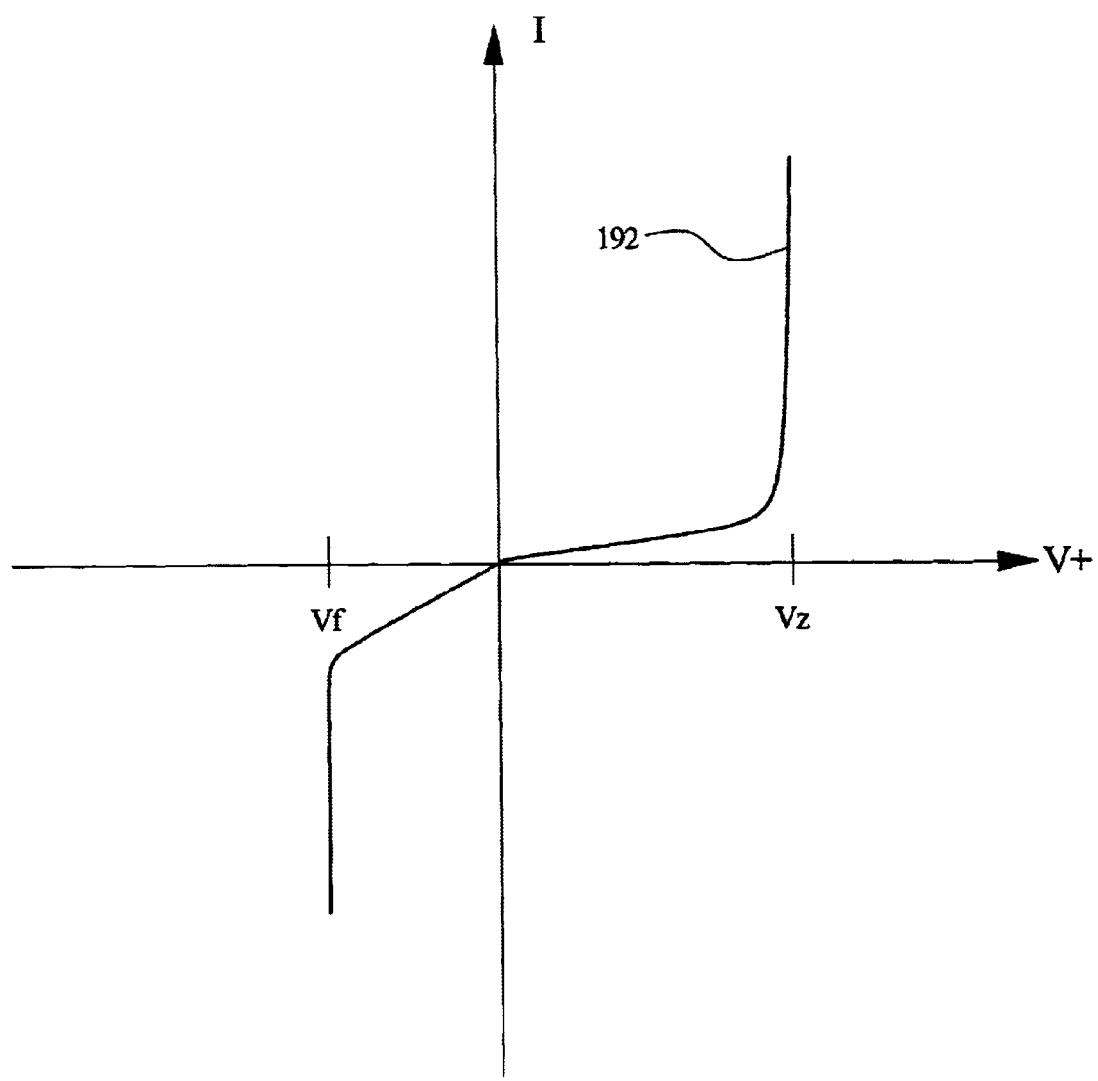
FIG. 6 illustrates a voltage versus current curve for a voltage suppressor of the present invention that has zener diode-like voltage-current characteristics.

Referring now to FIG. 6, the voltage suppressor 104, in the above example, has, in an embodiment, zener diode-like voltage-current characteristics, which are schematically illustrated by the curve 192. Curve 192 shows that virtually no current flows through the suppressor 104 until a positive voltage $V_+$ approaches the reverse breakdown or zener voltage $V_z$. The zener-like suppressor 104 pulls the voltage towards a maximum reverse breakdown or zener voltage $V_z$. The zener voltage $V_z$ is selected so that it is above the normal operating voltage but below an unacceptable voltage for the load. In this manner, the voltage suppressor 104 protects, i.e., eliminates the possibility of, excessive positive voltages $V_+$ occurring across the load.

Similarly, if the polarity is reversed, a forward voltage drop $V_f$ of, e.g., less than a volt for a typical silicone diode, occurs, which is typically acceptable for the load. It should be appreciated that voltage suppressor 104 protects the load from positive overvoltages $V_+$ applied at mounting pad termination 120 by clamping or limiting the voltage at the load to a zener voltage level $V_z$ and likewise protects the load from excessive negative voltages by clamping or limiting potential reverse polarity voltages to the forward voltage $V_f$.

Furthermore, as the voltage suppressor 104 experiences continuous overvoltages it begins to heat due to increased power dissipation. The heat is conducted down the vias 186 like a heat pipe or a heat sink to the PTC element 106. The temperature of the PTC element 106 increases as a result of Joule self-heating and thermal energy generated by the voltage suppressor where the element eventually switches to a high resistance state. In this state, current flow through the voltage suppressor 104 is limited, thereby preventing damage to the circuit. It should be noted that in this mode of operation, the switching of the PTC material is due to the combination of the heating of the voltage suppressor and the self-heating of the PTC material due to the rise in current.

The PTC element 106 will also switch into a current limiting mode if the load resistance is reduced sufficiently by an overload or a short circuit condition. In this scenario, the device provides traditional overcurrent protection of the circuit.

Advantageously, when any of the above fault conditions are corrected and the power is cycled off and on, the device will reset automatically. To this extent, there is no changing of a fuse or manual resetting of a circuit breaker.

The integrated device is advantageous for many reasons. For example, the integrated device provides faster PTC switching during an overvoltage condition than can occur with discrete devices. This is due to the high degree of thermal coupling between the voltage suppressor 104 and the PTC element 106. Specifically, the heating affect of the PTC element 106 is accelerated and, in turn, the switching of the PTC element to the high resistance condition occurs faster because the switching is related to the temperature.

As a result, the integrated overvoltage and overcurrent device 100 described above protects a circuit against harmful excessive voltage or current, whether the current is an overload or a short circuit. Thus, the present invention reduces the footprint required on the printed circuit board from that needed with two or more discrete devices occupying two different spaces on the printed circuit board.

Moreover, the integrated device of the present invention assures electrical coordination between the voltage suppressor 104 and PTC carrier 106. To this extent, a circuit designer does not have to worry that his/her selection of the two discrete components by, for example, different manufacturers coordinate properly. Thus, the designer can spend more time contemplating other features of the circuit and be assured that the integrated device provides sufficient overvoltage and overcurrent protection.

Figure 7:
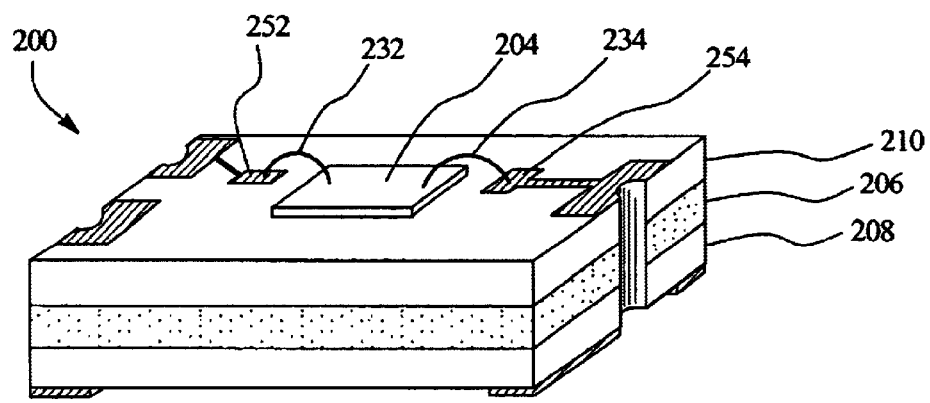
FIG. 7 illustrates a perspective view of an alternative embodiment of the present invention.
Figure 8:
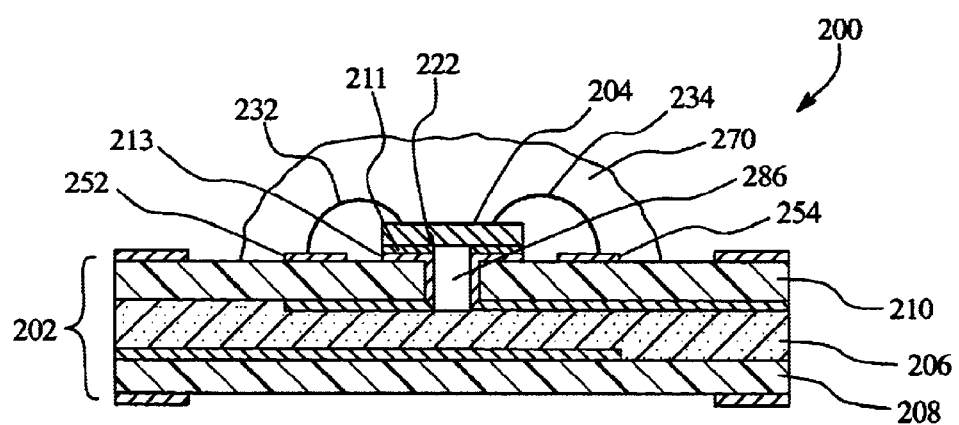
FIG. 8 illustrates a cross-sectional view of the embodiment (including an encapsulation layer) of FIG. 7.

As an alternative to the overcurrent and overvoltage protection device 100 in the package, FIGS. 7 and 8 show an alternative device 200 in a chip on board package. The chip on board device 200 includes a PTC carrier 202 and a bare semiconductor die 204. Similar to the PTC carrier in the device 100, the PTC carrier 202 in this embodiment includes a PTC element 206 and first and second substrates 208, 210. The semiconductor die 204 is attached to a top side 211 of a die bond pad 213 on a PTC carrier 202. The semiconductor die 204 can be attached to the die bond pad 213 by a bond adhesive 222 using conventional solder or conductive epoxy techniques. Bond wires 232 and 234 connect bond pads (not shown) of the semiconductor die 202 to the bond pads 252 and 254 on the PTC carrier 202. The semiconductor die pad 213 is thermally coupled to the PTC element 206 by one or more vias or heat pipes 286. As described above regarding the design, the vias 286 can be filled either with plating material, a conductive epoxy, a solder or combination thereof.

The chip on board device 200, may provide even better thermal coupling characteristics because the semiconductor die 204 can sit directly on top of the heat sink and adhesive bond. Indeed, the semiconductor die 204 is in even closer thermal contact with the heat sink 286 and the PTC element 206 than the semiconductor package described above with respect to the device 100.

Moreover, as shown in FIG. 8, a protective encapsulation 270 such as, for example, an ultraviolet light cured epoxy, can be applied over the semiconductor die 202 and bond wires 232 and 234.

The above devices 100, 200 incorporate voltage suppressors that may have zener diode-like characteristics. Generally, zener diode-like characteristics are ideal for providing protection in direct current ("DC") power applications. Such applications include battery operated equipment, cellular phones, computers, etc.

Figure 9:
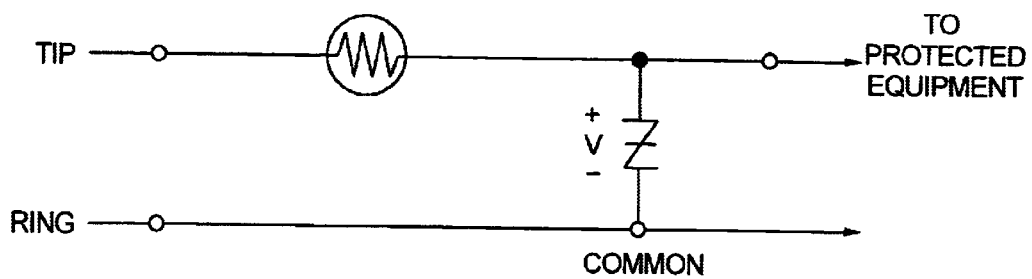
FIG. 9 illustrates a circuit diagram for a circuit that has overvoltage and overcurrent protection for telecommunication applications.
Figure 10:
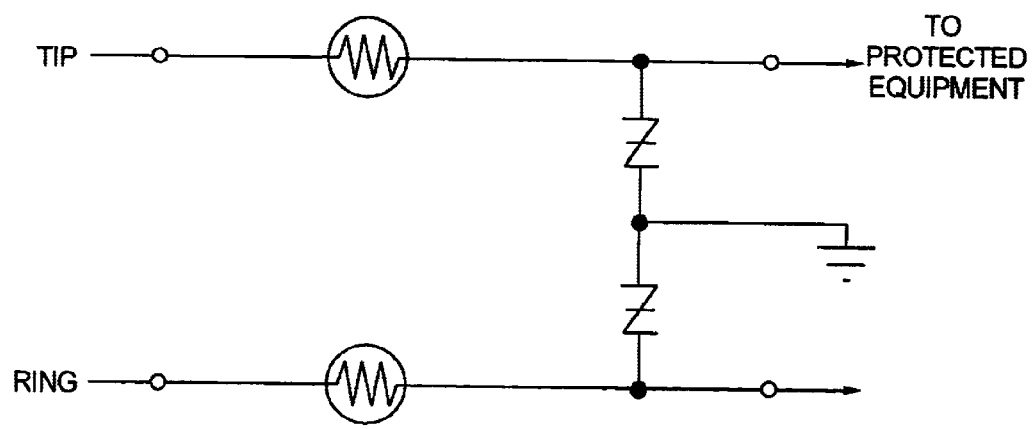
FIG. 10 illustrates another example of a circuit diagram for a circuit that has overvoltage and overcurrent protection for telecommunications applications.

However, the devices 100, 200 can include voltage suppressors such as varistors or thyristors having characteristics useful in protecting against overvoltage conditions for different applications. For example, FIGS. 9 and 10 show circuit diagrams for overvoltage and overcurrent protection of telecommunication equipment. The circuits of FIGS. 9 and 10 are commonly used to protect "Tip" and "Ring" connections such as modems telephones, facsimile machines, and line cards. While the circuits of FIGS. 9 and 10 are appropriate for copper twisted pair environments, other voltage environments are also suitable for circuits sought to be protected such as alarm circuits, power supplies, remove sensors, CATV, data lines, etc.

In this regard, the devices 100, 200 described above can be adapted to protect such systems. In telecommunication systems, thyristor characteristics, preferably that of a bi-directional thyristor, are often necessary to protect sensitive circuitry from harmful excess voltages that can occur, for example, from lighting or when a power line falls across the wiring. Generally, as voltage increases in the thyristor, it reaches a breakdown level in which the voltage folds back and drops to a lower voltage.

In addition, it is within the contemplation of the present invention that the overvoltage and overcurrent protection devices discussed herein may include more than one PTC element. Such PTC multi-layer configurations provide for a higher hold current within the same footprint of the device. Examples of such PTC multi-layer configurations is disclosed in U.S. application Ser. No. 09/510,116, filed Feb. 22, 2000, incorporated herein be reference.

Moreover, the overvoltages and overcurrent protection devices of the present invention may include more than one region of PTC material between the substrates 108, 110. Alternatively, there may be one PTC region with a number of electrodes on the respective surface of each substrate.

Figure 11:
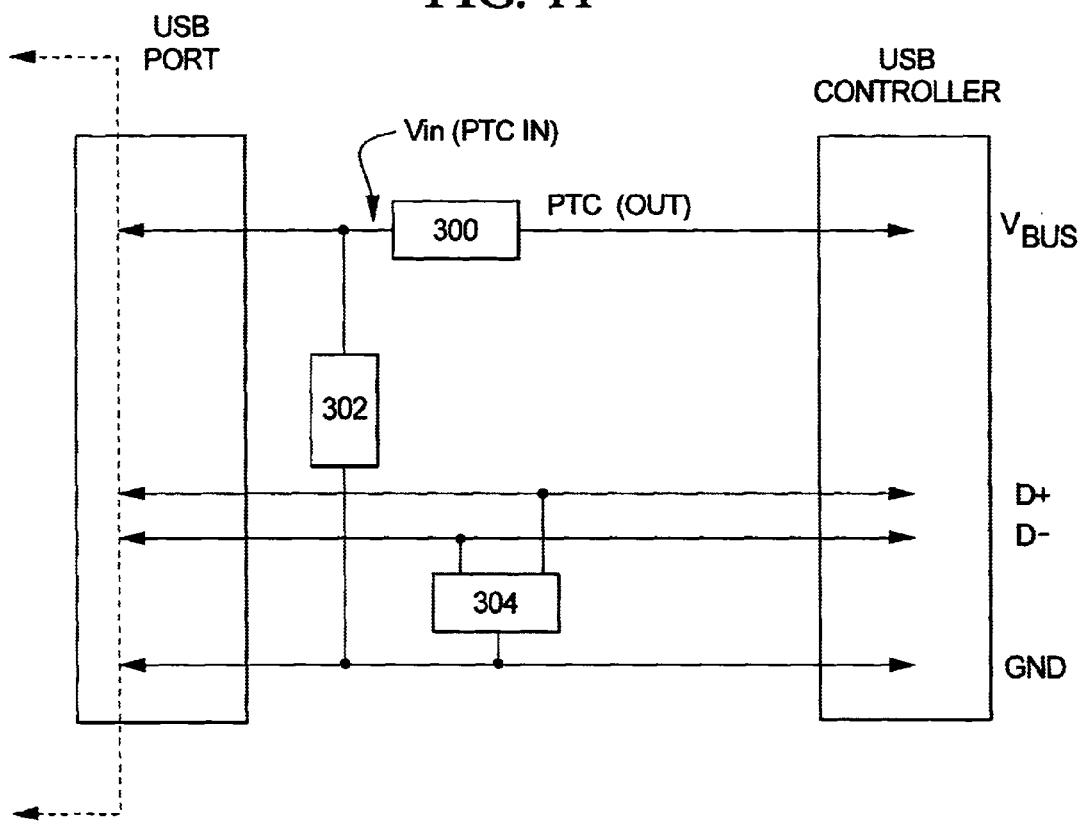
FIG. 11 illustrates a schematic diagram for a circuit that has overvoltage protection and overcurrent protection for data transmission or AC or DC power applications.

FIG. 11 illustrates another circuit diagram involving overvoltage and overcurrent protection in Universal Serial Bus ("USB") applications. This diagram incorporates three discrete devices: a PTC device 300, a varistor 302, and a voltage variable device 304. The voltage variable device includes a voltage variable material ("VVM"), which is described below.

Figure 12:
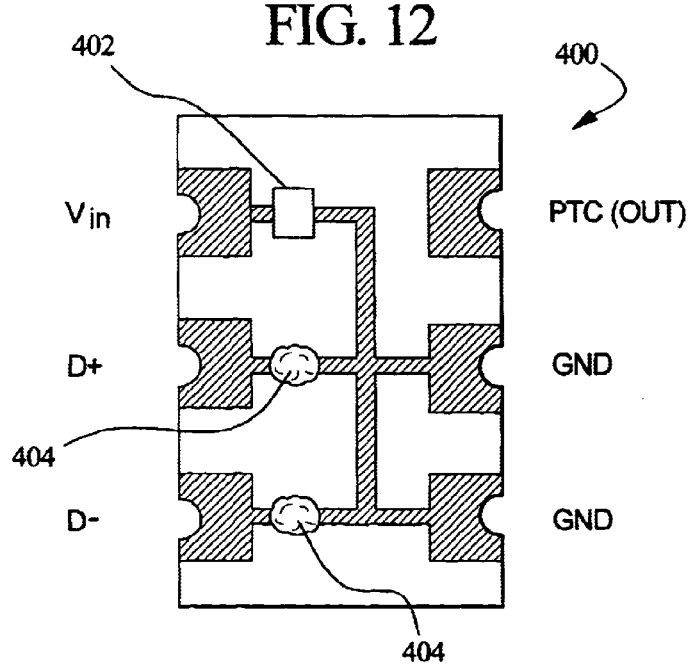
FIG. 12 illustrates a top plan view of another embodiment of the present invention.

FIG. 12 illustrates an embodiment of the present invention for overvoltage and overcurrent protection in data transmission applications and in particular USB and Institute of Electrical and Electronics Engineers ("IEEE") 1394 applications. This device 400 includes a PTC carrier (similar to the PTC carriers described above and not shown in FIG. 12) and a varistor 402 as the voltage suppressor for the protection of overvoltage conditions. Additionally, VVM 404 is incorporated for further protection against electrical overstress ("EOS") transients. The VVM is disposed on the second substrate of the PTC carrier. As a result of the integration of the three devices 300, 302 and 304 (FIG. 11), the overvoltage and overcurrent device 400 of the present invention provides a single discrete device that assures protection against overcurrents, overvoltages and EOS transients.

Figure 13A:
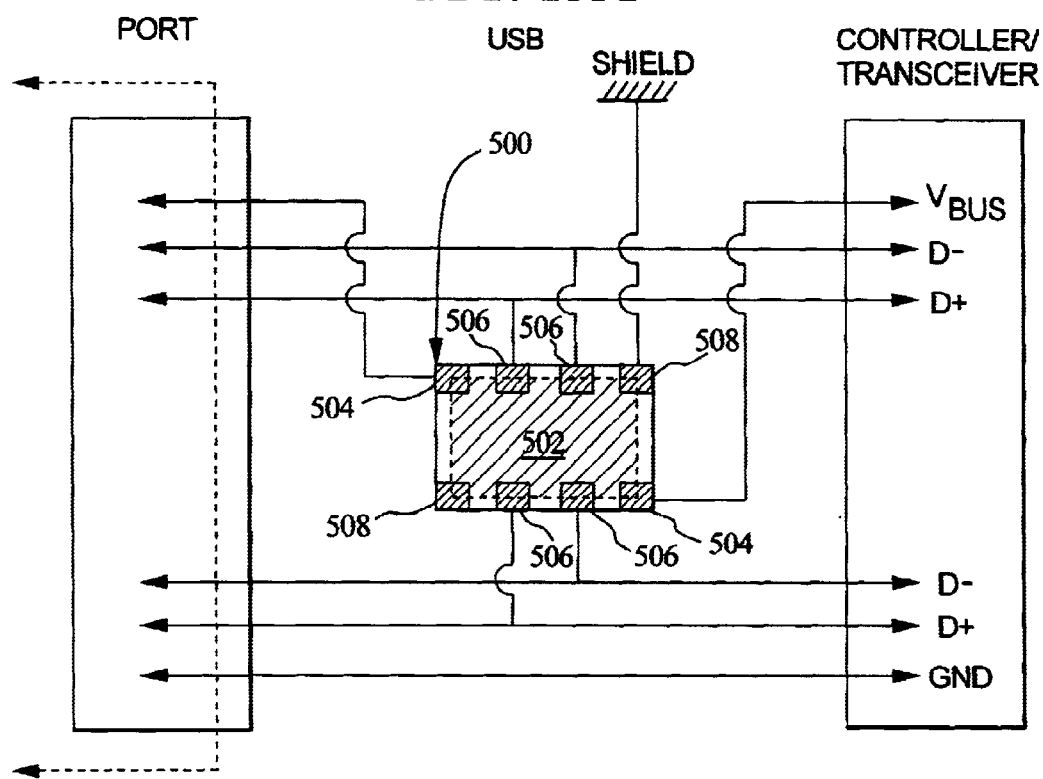
FIGS. 13A and 13B illustrate schematic diagrams for circuits that have ESD and overcurrent protection for data transmission applications, which show a further embodiment of the present invention.
Figure 13B:
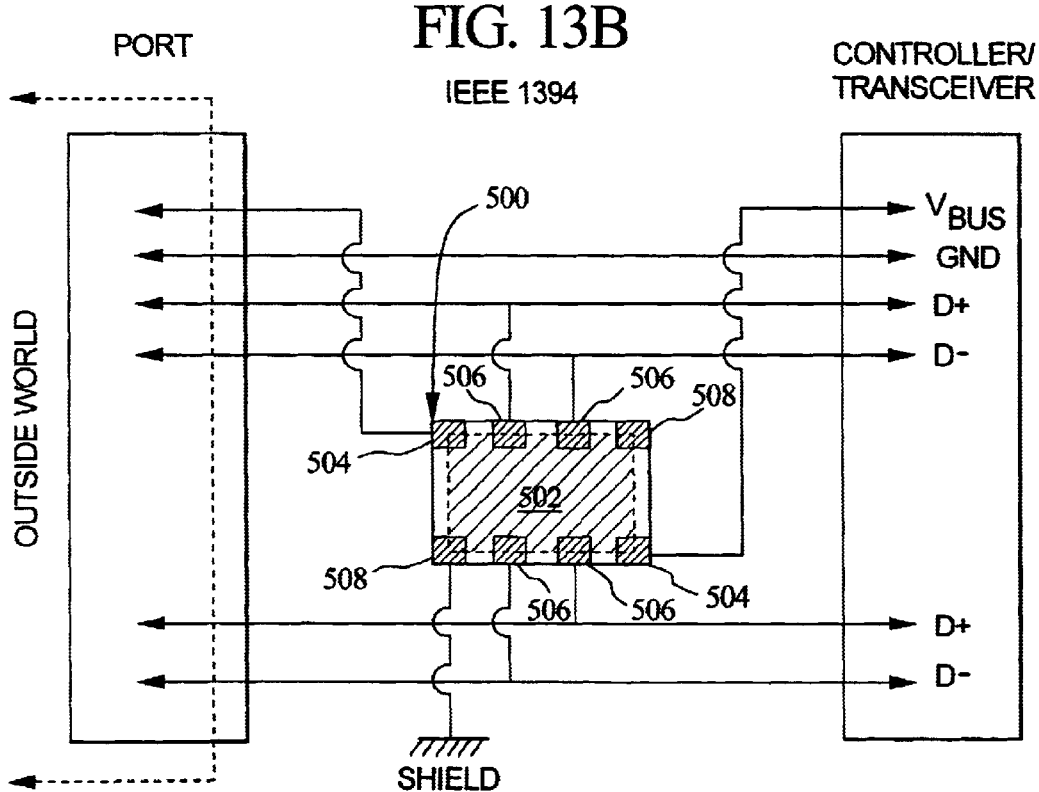

Referring now to FIGS. 13A and 13B, another embodiment of the present invention for ESD and overcurrent protection in data transmission applications and in particular USB and IEEE 1394 applications is illustrated. FIGS. 13A and 13B illustrate a device 500 that includes an overcurrent protection portion, which in a preferred embodiment is a PTC carrier (similar to the PTC carriers described above and not shown in FIGS. 13A and 13B). Device 500 includes both single and multiple substrates as disclosed above. Device 500 integrates the overcurrent protection device with a layer of VVM 502, which in an embodiment is disposed on an outer surface of the device 500. The VVM 502 is applied in a desired thickness.

Those skilled in the art should understand that certain VVM's inherently adhere to the device 500. With other types of VVM's, the VVM 502 is applied using a suitable adhesive, such as an epoxy. In a further alternative embodiment, the VVM 502 is applied to the device 500 and then coated and sealed using a suitable sealant, such as silicone or polyurethane. In an embodiment, a single quantity of VVM 502 covers all required areas on a surface of the device 500. In another embodiment, separate VVM areas may be employed.

Although not illustrated, one or more well known spark gaps may be employed in combination with the VVM 502. Spark gaps typically occur between a voltage supply or signal line termination and a ground termination. When a transient EOS event such as an ESD occurs, an arc occurs across the gap and the surge dissipates to ground. In an embodiment, therefore, a spark gap is employed between a Vbus or PTC termination 504 and a ground or shield termination 508. In another embodiment, a spark gap is employed between one or more data terminator 506 and the ground or shield terminator 508.

Where spark gaps exist, the VVM 502 preferably covers at least a portion if not all of the gap. VVM 502 applied across the gap reduces the breakdown voltage and eliminates much of the unpredictability with spark gaps due to environmental concerns, such as temperature and humidity. Spark gaps without VVM can also degrade after repeated power surges. It should be appreciated that the illustrated surface of the device 500 may include a plurality of spark gaps, wherein each gap is preferably covered with VVM 502.

FIGS. 13A and 13B illustrate that the VVM 502 is applied to one surface of the device 500. It should be appreciated that a plurality of the surfaces of the device 500 may have VVM 502 and terminations therefore. Likewise, in an embodiment, a plurality of surfaces of the device 500 have spark gaps. In another embodiment, a plurality of the surfaces of the device 500 have a plurality of spark gaps.

The device 500 in an embodiment includes a plurality of overcurrent or PTC terminations 504, a plurality of overvoltage or data terminations 506 and a plurality of common terminations 508. The overcurrent or PTC terminations 504 electrically communicate with a PTC element such as the PTC elements 106 and 206 described above and the VVM 502 as illustrated in FIGS. 13A and 13B. The device 500 therefore provides resettable overcurrent and overvoltage protection for a power source associated with a data transfer interface. The overvoltage or data terminations 506 electrically communicate with the VVM 502 as illustrated. The device 500 therefore provides resettable overvoltage or ESD protection for a plurality of the data lines associated with the data transfer interface.

The common terminations 508 are typically connected to chassis ground rather than signal or logic ground. Chassis ground is preferred over signal ground for an ESD "dump". The PTC terminations 504 in an embodiment provide the serial connection for the PTC structure and are electrically isolated from the ESD protection circuitry.

In an embodiment, the device 500 is provided in a small 1812 package size, which fits onto the existing pad layout for the traces of known data transfer interface ports. The device is alternatively provided in a 2029 or 3425 package size. FIG. 13A schematically illustrates the device 500 in operation with one such port, namely, a USB port. The PTC terminations 504 electrically communicate with the Vbus line extending to the controller/transceiver and the USB port. The data terminations 506 electrically communicate with a plurality of data lines extending to the controller/transceiver and the USB port. The data terminations 506 also communicate with one or more common termination 508, which connects to the chassis ground or shield.

FIG. 13B schematically illustrates the device 500 in operation with an IEEE 1394 port. Again, the overcurrent or PTC terminations 504 electrically communicate with the Vbus line extending to the controller/transceiver and the USB port. The data terminations 506 electrically communicate with a plurality of data lines extending to the controller/transceiver and the USB port. The overvoltage or data terminations 506 also communicate with one or more common termination 508, which connects to the chassis ground or shield.

The VVM for the embodiments disclosed in connection with FIGS. 12, 13A and 13B includes any of the materials hereafter disclosed in the cited references, the teachings of each of which are specifically incorporated herein by reference. U.S. Pat. No. 6,251,513, B1 entitled, Polymer Composites for Overvoltage Protection, assigned to the assignee of this invention, discloses compositions for providing protection against EOS. The compositions include a matrix formed of a mixture of an insulating binder, conductive particles having an average particle size of less than 10 microns, and semiconductive particles having an average particle size of less than 10 microns. The compositions utilizing relatively small particle sized conductive and semiconductive fillers exhibit clamping voltages in a range of about 30 volts to about 2,000 volts or greater.

U.S. Pat. No. 2,273,704, issued to Grisdale, discloses granular composites which exhibit non-linear current voltage relationships. These mixtures are comprised of granules of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991, issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductor and semiconductor particles in the 10 to 100 micron range with a minimum portion of 100 angstrom range insulative particles, bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

By way of further example, not limitation, additional EOS polymer composite materials that can be used in the present invention are also disclosed in U.S. Pat. Nos. 4,331,948, 4,726,991, 4,977,357, 4,992,333, 5,142,263, 5,189,387, 5,294,374, 5,476,714, 5,669,381, and 5,781,395, the teachings of which are specifically incorporated herein by reference.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

We claim:

1. An electrical circuit protection device, comprising:
    an overcurrent protection portion having a first substrate, a second substrate and a PTC element disposed between the first and second substrates, each of the first and second substrates having an outer surface;
    a voltage variable material disposed on at least one of the outer surfaces of the substrates;
    an overcurrent termination that electrically communicates with the overcurrent protection portion; and
    an overvoltage termination that electrically communicates with the voltage variable material.

2. The device of claim 1, wherein the overcurrent protection portion includes each substrate having an electrode disposed thereon, and the PTC element positioned between the first and second substrates and electrically connected to the electrodes.

3. The device of claim 2, wherein the substrates each include an outer surface, and the voltage variable material is disposed on the outer surfaces.

4. The device of claim 1, wherein the overcurrent termination electrically communicates with the overcurrent protection portion and the voltage variable material.

5. The device of claim 1, which includes a plurality of overvoltage terminations.

6. The device of claim 1, wherein the surface defines a gap, the gap is at least partially covered by the voltage variable material.

7. The device of claim 1, further comprising a common termination and a spark gap, the spark gap located on the surface between the overcurrent termination and the common termination, the spark gap is at least partially covered by the voltage variable material.

8. The device of claim 1, further comprising a common termination and a spark gap, the spark gap located on the surface between the overvoltage termination and the common termination, the spark gap is at least partially covered by the voltage variable material.

9. The device of claim 1, which includes a plurality of overvoltage terminations that are configured to electrically communicate with a plurality of data lines disposed on a printed circuit board.

10. An electrical circuit protection device, comprising:
    an overcurrent protection portion having a surface;
    a voltage variable material disposed on the surface;
    an overcurrent termination that electrically communicates with the overcurrent protection portion; and
    an overvoltage termination that electrically communicates with the voltage variable material;
    wherein the overvoltage and overcurrent terminations are configured to electrically communicate on a printed circuit board with a Universal Serial Buss port or an Institute of Electrical and Electronics Engineers ("IEEE") 1394 port.

11. An electrical circuit protection device, comprising:
    an overcurrent protection portion having a surface;
    a voltage variable material disposed on the surface;
    an overcurrent termination that electrically communicates with the overcurrent protection portion; and
    an overvoltage termination that electrically communicates with the voltage variable material;
    wherein the device is provided in an 1812 package size.

12. An electrical circuit protection device, comprising:
    an overcurrent protection portion having a surface;
    a voltage variable material disposed on the surface;
    an overcurrent termination that electrically communicates with the overcurrent protection portion; and
    an overvoltage termination that electrically communicates with the voltage variable material;
    wherein the device is provided in a 2029 package size.

13. An electrical circuit protection device, comprising:
    an overcurrent protection portion having a surface;
    a voltage variable material disposed on the surface;
    an overcurrent termination that electrically communicates with the overcurrent protection portion; and
    an overvoltage termination that electrically communicates with the voltage variable material;
    wherein the device is provided in a 3425 package size.

14. An electrical circuit protection device, comprising:
    an overcurrent protection portion having a surface;
    a voltage variable material disposed on the surface;
    an overcurrent termination that electrically communicates with the overcurrent protection portion; and
    an overvoltage termination that electrically communicates with the voltage variable material;
    wherein the voltage variable material includes a matrix of conductive and semiconductive particles.

15. The device of claim 1, wherein the voltage variable material includes irregularly shaped conductor particles having insulative oxide surface coatings that are bound in a matrix.

16. The device of claim 1, wherein the voltage variable material includes a mixture of conductive and semiconductive particles having surfaces coated with an insulative oxide film, the conductive and semiconductive particles being bound together in an insulative binder.

17. The device of claim 1, wherein the voltage variable material includes conductive and semiconductive particles that are coated with an insulative oxide film and that are bound together in point contact with one another.

18. An electrical circuit protection device, comprising:
    an overcurrent protection portion having a surface;
    a voltage variable material disposed on the surface;
    an overcurrent termination that electrically communicates with the overcurrent protection portion;

an overvoltage termination that electrically communicates with the voltage variable material;

a common termination; and a spark gap on the surface between the common termination and one of the overvoltage termination and the overcurrent termination, wherein the voltage variable material at least partially covers the spark gap.

19. The device of claim 18, wherein the surface is a first surface and the overcurrent protection portion further includes a second surface, and voltage variable material disposed on the second surface.

20. The device of claim 19, wherein the second surface has a plurality of terminations and a spark gap between two of the terminations, the spark gap being at least partially covered by the voltage variable material.

21. An electrical circuit protection device, comprising:

a first substrate having top and bottom surfaces and an electrode disposed on the top surface;

a second substrate having top and bottom surfaces and an electrode disposed on the bottom surface;

a PTC element positioned between the first and second substrates and electrically connected to the electrodes; and a voltage variable material disposed on the top surface of the second substrate.

22. The device of claim 21, which includes voltage variable material disposed on the bottom surface of the first substrate.

* * * * *